United States Patent

Crowley et al.

Patent Number: 6,081,117
Date of Patent: Jun. 27, 2000

[54] NOISE MODULATION FOR OPEN ACCESS AND REMOTELY POSITIONED MRI

[75] Inventors: Christopher W. Crowley, San Diego; Freeman H. Rose, Jr., Del Mar, both of Calif.

[73] Assignee: Panacea Medical Laboratories, Carlsbad, Calif.

[21] Appl. No.: 08/908,083

[22] Filed: Aug. 11, 1997

[51] Int. Cl.⁷ .................................................. G01V 3/00
[52] U.S. Cl. ........................................... 324/307; 324/309
[58] Field of Search ..................... 324/309, 307, 324/306, 312, 314, 300

[56] References Cited

U.S. PATENT DOCUMENTS

| | | |
|---|---|---|
| 4,498,048 | 2/1985 | Lee et al. . |
| 4,520,315 | 5/1985 | Loeffler et al. . |
| 4,612,504 | 9/1986 | Pelc . |
| 4,663,591 | 5/1987 | Pelc et al. . |
| 4,717,879 | 1/1988 | Riederer et al. . |
| 4,829,252 | 5/1989 | Kaufman . |
| 4,862,083 | 8/1989 | McKinnon et al. . |
| 4,876,508 | 10/1989 | Taylor . |
| 5,111,146 | 5/1992 | Kuhn . |
| 5,260,656 | 11/1993 | Cory . |
| 5,274,331 | 12/1993 | Macovski . |
| 5,304,930 | 4/1994 | Crowley et al. . |
| 5,309,101 | 5/1994 | Kim et al. . |
| 5,336,999 | 8/1994 | Mansfield et al. . |
| 5,390,673 | 2/1995 | Kikinis . |
| 5,412,363 | 5/1995 | Breneman et al. . |
| 5,481,192 | 1/1996 | Mehlkopf et al. . |
| 5,493,225 | 2/1996 | Crowley et al. . |
| 5,825,184 | 10/1998 | Gullapalli et al. ........... 324/309 |

*Primary Examiner*—Louis Arana
*Attorney, Agent, or Firm*—Nydegger & Associates

[57] ABSTRACT

A method for creating an image of in situ biological tissue uses an inhomogeneous field MRI device to pulse the tissue with sequential epochs of excitation pulses. Each epoch of excitation pulses includes, in order, an initial tilting pulse, an x-y encode and a train of refocussing pulses. Specifically, each x-y encode has a K-space identifier of the form $i(1 \ldots m)+j(1 \ldots n)$, and the tilting pulses change sign according to whether the K-space identifier $(i+j)$ is odd or even. For an image having m×n pixels, n×n epochs are used to generate n×n measurements of imageable spin echo signals. These m×n measurements are then collated to create the image.

12 Claims, 2 Drawing Sheets

NOISE MODULATION FOR OPEN ACCESS AND REMOTELY POSITIONED MRI

FIELD OF THE INVENTION

The present invention pertains generally to magnetic resonance imaging (MRI) systems. More particularly, the present invention pertains to image processing techniques for MRI systems. The present invention is particularly, but not exclusively, useful as a method for suppressing noise while imaging in situ biological tissue using inhomgeneous field MRI devices.

BACKGROUND OF THE INVENTION

It is well known that a visually cognizable image can be created by placing many individual picture elements (i.e. pixels) in a proper arrangement. For example, video displays create images in this manner, and images which are included in digital data transmissions are recreated using pixels. It is also the case that images which are created using nuclear magnetic resonance techniques (MRI), must be collated from data as pixels.

For purposes of discussion, in order to better appreciate the notion of pixels in the context of the present invention, consider a substantially rectangular, two dimensional image in an x-y plane. Further, consider that the image, or picture, is divided into an "m" number of segments in the x direction and into an "n" number of segments in the y direction. In this arrangement, the image would comprise m×n pixels. As is well known, and easily demonstrated, if all of the pixels in the image are sufficiently small the human eye is incapable of distinguishing individual pixels. Instead, due to the small size of the individual pixels, they blend together into a coherent continuous image. Thus, the total image, rather than individual pixels, is perceived.

As implied above, images that are created using MRI techniques will comprise an arrangement that includes a large number of potentially individually different pixels. Due to the nature of MRI, however, the process of creating individual pixels for an MRI image requires some means for distinguishing each of the pixels from all of the other pixels in the image. To make these distinctions, MRI techniques typically include some scheme for encoding the pixels so that they may be subsequently recaptured to create the desired image.

In order to consider the specifics of an encoding scheme, it is first to be appreciated that, in an MRI procedure, the in situ biological tissue to be imaged is irradiated with radio frequency (RF) signals. Importantly, these signals have a particular frequency which is dependent on the magnetic field strength in the location of the tissue that is to be imaged. This frequency is technically referred to as the Larmor frequency. As is well known in the art, irradiation of tissue at the Larmor frequency causes nuclei of the tissue to generate spin echo signals. For purposes of MRI, these spin echo signals are recordable. The recorded spin echo signals, however, must be processed in order to obtain a cognizable image.

One of the problems to be overcome when processing MRI signals stems from the fact that all of the in situ biological tissue that is to be imaged, is irradiated simultaneously. Accordingly, each irradiation results in a measurement which includes the spin echo signals from all of the nuclei in the tissue. It happens that in order to generate m×n pixels for an image, m×n encodings must be accomplished. Without encoding, however, all responses to the plurality of irradiation epochs would be the same and there would be no way to distinguish the response of nuclei in one portion of the tissue from the response of nuclei in other portions of the tissue. Thus, encoding is required.

The method envisioned by the present invention for encoding pixels of an MRI image employs a two dimensional phase encoding scheme. For phase encoding, each encode signal is characterized by a distinctive two dimensional spatial pattern of phase. By changing the phase from one encode signal to another for each irradiation of the imaged tissue, distinctions can be made in the spin echo signals that are generated. These distinctions will then be useful in sorting out and distinguishing the various pixels during recreation of the image.

In addition to the technical aspects of phase encoding, it is also necessary to consider when the phase encoding should be accomplished in an MRI procedure. For remotely positioned MRI devices which employ substantially inhomogeneous magnetic fields, specific techniques are involved, and specific time sequences for encoding need to be observed. U.S. Pat. No. 5,304,930, which issued to Crowley et al. for an invention entitled "Remotely Positioned MRI System", and which is assigned to the same assignee as the present invention, discloses methods for creating images using inhomogeneous magnetic fields.

Briefly, the '930 patent discloses and claims a remotely positionable MRI device which includes a magnet for generating a static inhomogeneous magnetic field that is external to the magnet. Importantly, the magnet is configured to establish a region in the magnetic field which can be effectively used as a substantially flat measurement surface. Further, the measurement surface is characterized by the condition that the magnitude of the field strength ($B_o$) is substantially constant, and the field gradient in the direction normal to the measurement surface ($G_z$) is approximately.

In accordance with the teachings of the '930 patent, an RF antenna is incorporated into the device to irradiate the nuclei in the measurement surface with a tilting pulse at the appropriate Larmor frequency. In a manner well known in the art, this first pulse tilts nuclei out of the spin orientation they had assumed under the influence of $B_o$ in the static magnetic field. Once tilted, the nuclei can be encoded. In order to encode the tilted nuclei, a first gradient coil and a second gradient coil are incorporated into the device and are used for changing magnetic field gradients in the measurement surface in both the x ($G_x$) and y ($G_y$) directions. More specifically, after the nuclei have been initially tilted by the first radiation pulse from the RF antenna, the first and second gradient coils can be selectively activated to orient the spin vectors of individual nuclei in the x-y plane of the measurement surface. This encodes the nuclei with a predetermined transverse phase pattern.

Another function of the RF antenna of the device disclosed in the '930 patent is to refocus the nuclei after they have been encoded. It happens that due to the permanent field gradient in a inhomogeneous magnetic field, nuclei within the gradient precess at different rates. This results in both coherent defocusing and incoherent diffusion of the nuclei which require that the nuclei be periodically refocussed at an accelerated rate. This refocussing is accomplished by transmitting a refocussing pulse at the appropriate Larmor frequency from the RF antenna. Importantly, accelerated refocussing, when combined with transverse gradient applications, and signal averaging results in the generation of encoded spin echo signals from the nuclei that are useable in image reconstruction.

The MRI device of the invention disclosed in the '930 patent also includes electronic means for coordinating the operations of the RF antenna (tilting and refocussing) with the operation of the encoding gradient coils. Specifically, the transmission of appropriate RF irradiation pulses from the antenna, the encoding of the nuclei by the first and second gradient coils, and the reception of encoded spin echo signals from the nuclei must occur in a predetermined and controlled sequence. Additionally, electronic means are required for converting a plurality of encoded spin echo signals into encoded NMR responses and, in turn, for converting a plurality of NMR responses into an image.

Further to the brief summary of the disclosure of the '930 patent presented above, the entire disclosure of the '930 patent is fully incorporated herein by reference. Additionally, it is to be appreciated that the systems and methods disclosed in the '930 patent as well as those for the present invention may be used in other systems that have inhomogeneous magnetic fields.

Superposed on the above discussion for MRI signal processing is the fact that the constant artifacts of noise potentially corrupt the finally created MRI image. Specifically, in the context of inhomogeneous field systems, the acoustic and electromagnetic remnants resulting from the accelerated RF irradiation pulses may present artifacts during each step of data recording. Unlike thermal noise, the aforementioned artifacts may be coherent, and hence, cannot be attenuated by averaging techniques. Furthermore, for phase encoding, it is known that pixels of the image which have been subjected to the least amount of phase change during encoding are more susceptible to noise corruption than are those pixels whose encoding phase changes have been more pronounced. Since a phase encoding is typically accomplished by varying the number of cycles of phase change along the entire field of view, it happens that the pixels at the center of the length of pixels will experience little, if any, encoding phase changes throughout the entire MRI procedure. On the other hand, those pixels which are farthest from the center will experience extensive changes in their encode phase from one encode to the next encode. The result is that the pixels at the center of the reconstructed image are most affected by noise. As a practical matter, this means that the center of the image is corrupted by noise, and that the corners of the image have the least artifact.

In light of the above, it is an object of the present invention to provide a method for suppressing acoustic noise from an MRI image which establishes the clearest resolution for the image at the center of the image. Another object of the present invention is to provide a method for suppressing noise from an MRI image which effectively filters constant artifacts, such as exogenous noise, from portions of an MRI image which require the best image resolution. Still another object of the present invention is to provide a method for suppressing noise from an MRI image which is relatively simple to implement and comparatively cost effective.

SUMMARY OF THE PREFERRED EMBODIMENTS

In accordance with the present invention, a method for suppressing noise from MRI imaging measurements of in situ biological tissue involves the use of an inhomgeneous field MRI device. In order to create a two dimensional image of the tissue having m×n pixels, it is necessary for the MRI device to generate m×n sequential epochs of excitation pulses. Specifically, for the present invention, each epoch includes an initial 90° tilting pulse which is followed by a train of 180° refocussing pulses. As is well known, each epoch will generate a measurement of imageable spin echo signals.

To distinguish one epoch measurement from another, a predetermined x-y encode is inserted into each epoch between the initial 90° tilting pulse and the subsequent train of 180° refocussing pulses. Each x-y encode can be unique by assigning a specific K-space identifier to the encode. For the present invention, each x-y encode will have a specific sequential K-space identifier which is in a form i(1 . . . m)+j(1 . . . n). The identification of spatial encoding patterns with K-space is well-known to those skilled in the art.

Importantly, the method of the present invention calls for sequentially alternating the initial 90° tilting pulses between successive epochs. Thus, an epoch which starts with a positive 90° tilting pulse will be followed by an epoch which has a negative 90° tilting pulse. In turn, this epoch with the negative 90° tilting pulse will be followed by an epoch with a positive 90° tilting pulse, and so on. The actual determination between a positive ninety degrees and a negative ninety degrees can be made according to the particular K-space identifier for the epoch. Specifically, for an image having m×n pixels, the initial 90° tilting pulse can be a negative ninety degrees when i+j of the K-space identifier is an odd number. On the other hand, the initial tilting pulse can be a positive ninety degrees when i+j is an even number.

Once all of the m×n measurements have been made for the image, conventional signal processing can be used to create the m×n pixels for the image. Due to the sequential alternating of phase for the initial ninety degree tilting pulses, the noise which would otherwise corrupt pixels in the center of the image is effectively filtered.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
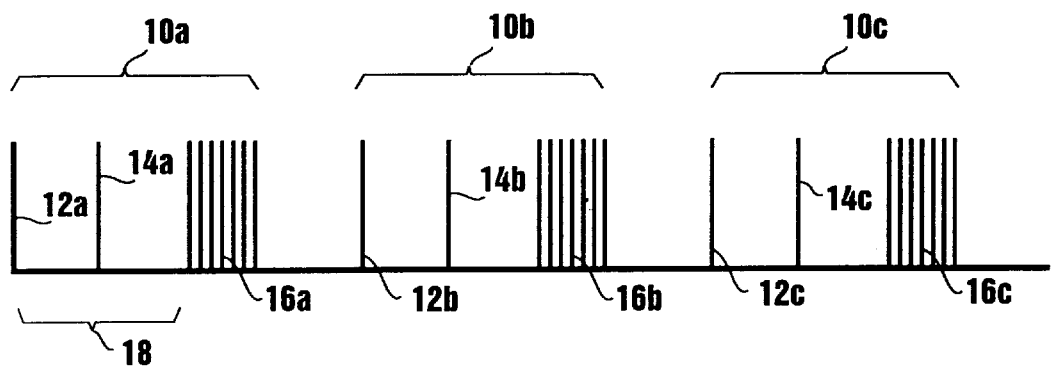
FIG. 1 is a schematic representation of a series of RF pulse epochs for the present invention.

Referring initially to FIG. 1, a time sequence series of representative epochs for RF irradiation pulses, as used for the methods of the present invention, are shown and individually designated with the numeral 10. Each epoch 10 *a–c* is shown to include an initial ninety degree (90°) tilting pulse 12 *a–c* which is followed by an initial 180° refocusing pulse 14 and, then, a train of one hundred and eighty degree (180°) refocussing pulses 16. Further, the train of refocussing pulses 16 follows the initial 90° tilting pulse 12 by a predetermined time delay 18. As is well known in the art, the sequence of a 90° tilting pulse 12, followed by a train of 180° refocussing pulses 16 is effective for generating recordable measurements of spin echo signals using a remotely positioned MRI device with an inhomogeneous field (see U.S. Pat. No. 5,304,930).

During the time delay 18, it is to be appreciated that the epoch 10 can be phase encoded with both x and y encodes which will distinguish the particular epoch 10 from all other epochs 10. For example, the epoch 10a will differ from the epoch 10b, which will differ from epoch 10c, in that they will each have a different x-y encode. The technical particulars of how this is done will be best appreciated by initially referring to FIG. 2.

Figure 2:
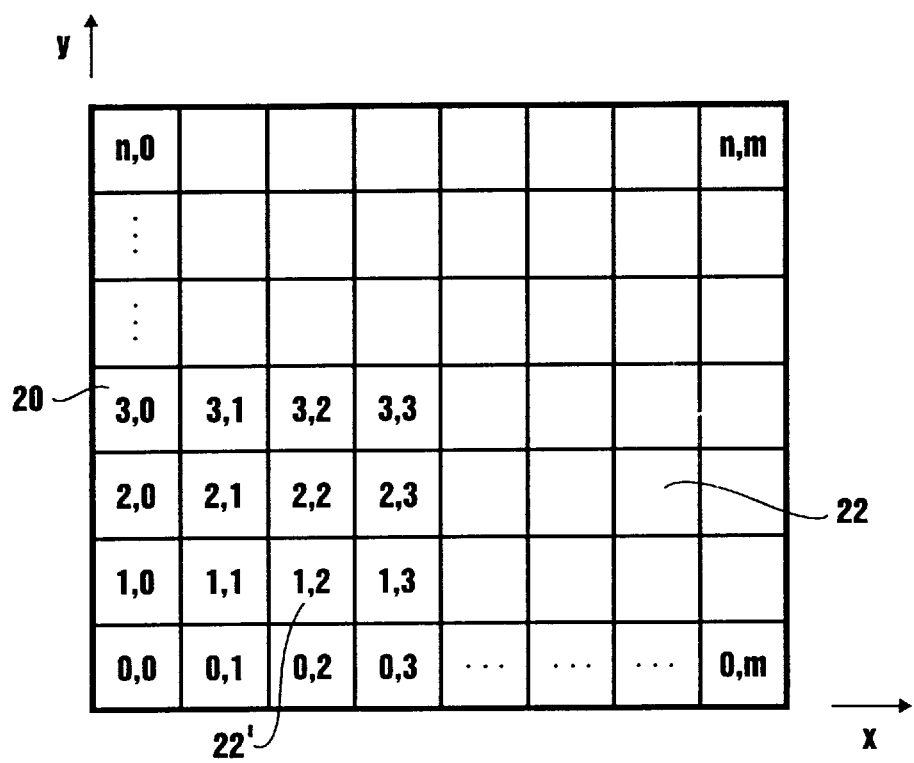
FIG. 2 is a matrix of K-space identifiers which represent the m×n spatial patterns of pixels that are to be used for the creation of an MRI image.

In FIG. 2 it will be seen that a matrix 20 is presented in the form i(1 . . . m)+j(1 . . . n). Specifically, it will be seen that the matrix 20 includes "m" number of segments 22 in the x direction and "n" number of segments 22 in the y direction. In the context of the present invention, the matrix 20 establishes K-space identifiers for each 22 which individually represent spatial patterns for the m×n pixels that will constitute the image of the irradiated tissue. For example, the segment 22' establishes the K-space identifier (1,2). This means that for the particular two dimensional encode, there will be a one cycle phase encode in one direction along the field of view and a two cycle phase encode in a different, transverse, direction along the field of view. The difference in cycle phase encodes, and the import this has for the present invention, will be best appreciated with reference to FIGS. 3 and 4.

Figure 3:
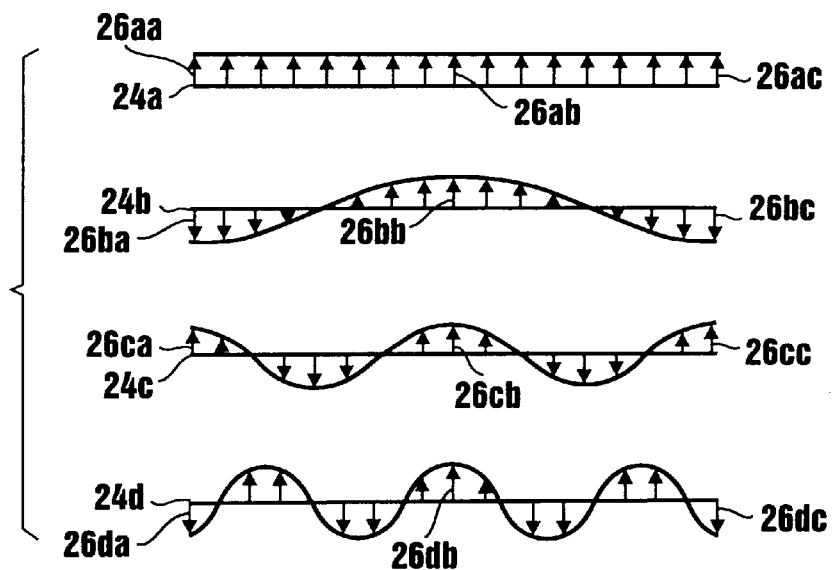
FIG. 3 shows a sequence of four representative cycle phase encodes which are useful for encoding the pixels of an MRI image.

FIG. 3 shows a sequence of four representative encodes 24a–d which are useful for encoding pixels of an MRI image. As shown, each of the encodes 24a–d includes a plurality of arrows 26 which individually represent the real component of phase magnetization for the tissue of a corresponding pixel. For example, the arrows 26aa, 26ab and 26ac respectively represent the real component of phase magnetization for pixels at one end of the field of view, at the center of the field of view, and at the opposite end of the field of view. As shown, the encode 24a could be either an x encode or a y encode. What is unique about the encode 24a, however, is that it represents a zero cycle phase encode. For a zero cycle phase encode, all arrows 26 in the encode 24a indicate that the real component of phase magnetization is the same for all pixels. On the other hand, as clearly shown in FIG. 3, the pixels of encodes 24b–d do not all have the same real component of phase magnetization. In fact, encodes 24b–d respectively represent a one-cycle phase encode, a two-cycle phase encode, and a three-cycle phase encode. It is helpful to compare the various encodes.

When considering the encode 24b, it can be seen that, unlike encode 24a, all of the pixels between arrow 26ba and arrow 26bc have different real components of phase magnetization. Further, it is to be recognized that the real components of phase magnetization between the arrows 26ba and 26bc vary through one cycle of three hundred and sixty degrees (360°). Interestingly, the real component of phase magnetization for arrow 26ab of encode 24a is the same as for the arrow 26bb of encode 24b.

Encode 24c (a two cycle encode) and encode 24d (a three cycle encode) shown in FIG. 3 represent further encoding phase changes. As will be appreciated, the phase changes will continue for successive encodes until the final encode, depending on the direction of the encode, will go through either "m" or "n" cycles of phase change. By analyzing the encodes 24a–d it will be apparent that the pixels near the center of the field of view (e.g. pixel/arrows 26ab, bb, bc, and bd) are subjected to the least amount of phase change during an encoding procedure. Thus, they are more susceptible to noise corruption than are those pixels farther from the center of the field of view whose encoding phase changes have been more pronounced.

The present invention has recognized that, while noise corruption may not be eliminated, or even diminished, the corrupting effect noise has on the creation of MRI images from inhomogeneous field MRI devices can be minimized. Specifically, noise effects can be moved to provide images which have less corruption in the center of the image where visual resolution is most needed. To do this, the combination of irradiation pulse epoch and encoding phase cycle are altered in a manner which more effectively filters the noise corruption from pixels in the center of the image. This, however, is at the cost of allowing pixels farther from the center to experience greater noise corruption.

In accordance with the present invention, the suppression of noise at the center of the viewing field is accomplished by alternating the phase of the initial 90° tilting pulse 12 from one epoch 10 to the next immediately successive epoch 10. For example, if the initial 90° tilting pulse 12a of epoch 10a is positive, the initial 90° tilting pulse 12b of epoch 10b will be negative. For epoch 10c the initial 90° tilting pulse 12c will then be positive, and so on. The effect of the alternation in the positive and negative sign of the initial 90° tilting pulse is seen in FIG. 4.

Figure 4:
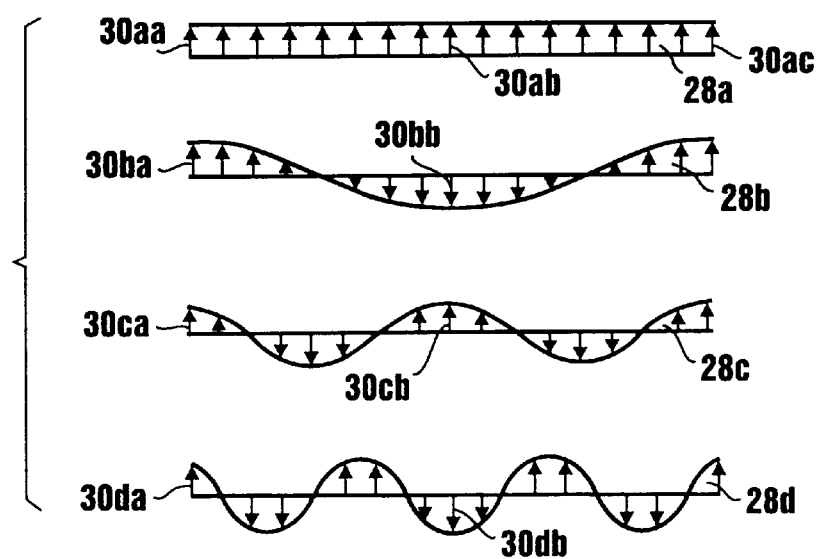
FIG. 4 shows the cycle phase encodes of FIG. 3 with compensating phase alteration to suppress noise from the center of the resultant image.

Like the encodes 24 of FIG. 3, FIG. 4 also shows a sequence of four representative cycle phase encodes 28. Also, in like manner, the encodes 28a–d in FIG. 4 are each shown with a succession of arrows 30 which each represent the real component of phase magnetization for the respective pixel. Again, like the encodes 24 of FIG. 3, the encodes 28a–d respectively represent a zero cycle phase encode, a one-cycle phase encode, a two-cycle phase encode, and a three-cycle phase encode. The cycle phase encodes of FIG. 4, however, have be been subjected to compensating phase alternation. The consequence of this is clearly seen when comparing FIG. 3 with FIG. 4.

First, compare the one-cycle phase encode 28b of FIG. 4 with the one-cycle phase encode 24b of FIG. 3. By this comparison, it will be noted that the pixels at the center of the field of view (respectively arrows, 30bb and 26bb) are approximately 180° out of phase with each other. Importantly, within the encoding scheme shown in FIG. 4, the pixel/arrow 30bb for the one-cycle phase encode is approximately 180° out of phase with the previous pixel/arrow 30ab and the subsequent pixel/arrow 30cb, respectively of the zero cycle phase encode 28a and the two-cycle phase encode 28c. Further, with the three-cycle phase encode 28c, the pixel/arrow 30db at the center of the field of view will be 180° out of phase with its previous pixel/arrow 30cb. Thus, unlike the uncompensated scheme for the encodes 24 shown in FIG. 3, the pixel/arrows 30 near the center of the field of view, as shown in FIG. 4, due to their compensating phase alternation, will effectively filter the noise.

In the operation of the methods for creating an image of in situ biological tissue in accordance with the present invention, the first step is to pulse the tissue nuclei with an initial 90° tilting pulse. Next, it is necessary to encode the tissue nuclei which has an x-y encode having a K-space identifier of a form i(1 . . . m)+j(1 . . . n). Once the tissue is encoded, the tissue nuclei are repetitively refocussed with a train of 180° pulses. Importantly, between successive epochs of pulses, the initial 90° tilting pulse is varied to use a positive 90° tilting pulse whenever i+j K-space identifier is even and a negative 90° tilting pulse whenever i+j is odd. This sequence of steps is then repeated m×n times to generate m×n separate measurements of imageable spin echo signals for creating image.

While the particular method for suppressing noise from an MRI image as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. In a system for creating an image of in situ biological tissue, using an MRI device to provide sequential epochs of excitation pulses in an inhomogeneous magnetic field, with each epoch generating a measurement of imageable spin echo signals, and wherein each epoch includes an initial 90° tilting pulse followed by at least one 180° refocussing pulse, a method which comprises the steps of:

inserting a predetermined x-y encode in each said epoch between said initial 90° tilting pulse and said at least one 180° refocussing pulse, each said encode having a sequential K-space identifier in a form i(1 . . . m)+j(1 . . . n);

alternating said initial 90° tilting pulses between a positive ninety degrees and a negative ninety degrees according to said K-space identifier and where said image has m×n pixels, said initial tilting pulse is a negative ninety degrees when i+j is an even number and said initial tilting pulse is a positive ninety degrees when i+j is an odd number;

pulsing the tissue with said sequential epochs to obtain a plurality of said measurements; and collating said measurements to create said image.

2. A method as recited in claim 1 wherein said K-space identifier is in a form i(1 . . . m)+j(1 . . . n) and, for said image having m×n pixels said initial tilting pulse is a negative ninety degrees when i+j is an odd number and said initial tilting pulse is a positive ninety degrees when i+j is an even number.

3. A method as recited in claim 1 wherein m=n.

4. A method as recited in claim 1 wherein for an image having m×n pixels, m×n measurements are taken using m×n different x-y encodes.

5. A method as recited in claim 1 wherein said MRI device generates an inhomogeneous magnetic field.

6. A method as recited in claim 1 wherein each said epoch comprises a plurality of 180° refocussing pulses.

7. A method as recited in claim 6 wherein said plurality of 180° refocussing pulses comprise a train of pulses.

8. A method as recited in claim 1 wherein said alternating step is accomplished sequentially.

9. A method for creating an image of in situ biological tissue using an MRI device having an inhomogeneous magnetic field which comprises the steps of:

a) pulsing the tissue nuclei with an initial 90° tilting pulse;

b) encoding the tissue nuclei with an x-y encode having a K-space identifier of a form i(1 . . . m)+j(1 . . . n);

c) refocussing the tissue nuclei with at least one 180° pulse;

d) using a positive 90° tilting pulse whenever i+j has a first parity and a negative 90° tilting pulse whenever i+j has a second parity and where said image has m×n pixels, said initial tilting pulse is a negative ninety degrees when i+j is an even number and said initial tilting pulse is a positive ninety degrees when i+j is an odd number; and e) repeating steps a through d above m×n times to generate m×n separate measurements of imageable spin echo signals for creating said image.

10. A method as recited in claim 9 wherein said method comprises a plurality of 180° pulses.

11. A method as recited in claim 10 wherein said plurality of 180° refocussing pulses comprise a train of pulses.

12. A method as recited in claim 9 wherein steps a through c are accomplished in sequence.

* * * * *